United States Patent [19]
Cho et al.

[11] 4,236,166
[45] Nov. 25, 1980

[54] VERTICAL FIELD EFFECT TRANSISTOR

[75] Inventors: Alfred Y. Cho, Summit; James V. DiLorenzo, Millington, both of N.J.

[73] Assignee: Bell Telephone Laboratories, Incorporated, Murray Hill, N.J.

[21] Appl. No.: 54,821

[22] Filed: Jul. 5, 1979

[51] Int. Cl.³ .............................................. H01L 29/80
[52] U.S. Cl. ........................................ 357/22; 357/23; 357/15; 357/16; 357/56; 357/61; 357/55; 357/60
[58] Field of Search ...................... 357/15, 22, 23, 16, 357/55, 56, 60, 61

[56] References Cited
U.S. PATENT DOCUMENTS

| | | | |
|---|---|---|---|
| 3,412,297 | 11/1968 | Amlinger | 357/23 |
| 3,823,352 | 7/1974 | Pruniaux et al. | 357/23 |
| 3,906,541 | 9/1975 | Goronkin | 357/22 |
| 4,075,652 | 2/1978 | Umebachi et al. | 357/22 |
| 4,157,556 | 6/1979 | Decker et al. | 357/22 |

OTHER PUBLICATIONS

IEEE Trans. on Elec. Dev.-vol. ED-21, No. 1, Jan. 1974, pp. 113-118 Lecrosnier et al.
IEEE Inter. Solid-State Cir. Conf.-Feb. 12, 1975, pp. 66-67 Vergnolle et al.
IEEE Trans. Elec. Dev.-Aug. 1975, pp. 613-614 Umebachi et al.
IEEE Trans. Microwave The. & Techs.-vol. MTT.-24, No. 6-Jun. 1976 pp. 305-311-Oakes et al.

*Primary Examiner*—Edward J. Wojciechowicz
*Attorney, Agent, or Firm*—Michael J. Urbano

[57] ABSTRACT

A vertical field effect transistor (10) includes a relatively wide bandgap, lowly doped active layer (18) epitaxially grown on, and substantially lattice matched to, an underlying semiconductor body portion (13). A mesa (20) of lower bandgap material is epitaxially grown on and substantially lattice matched to the active layer. A source electrode (22) is formed on a bottom major surface (34) of the semiconductor body portion, a drain electrode (24) is formed on the top of the mesa, and a pair of gate electrode stripes (26) are formed on the active layer adjacent both sides of the mesa. When voltage ($V_G$), negative with respect to the drain, is applied to the gate electrodes, the depletion regions (28) thereunder extend laterally in the active layer until they intersect, thereby pinching off the flow of current in the channel extending from the drain and source electrodes. Also described is an embodiment in which spaced-apart, high impedance zones (30) underlie the active layer and the mesas, and the spaces between zones underlie the gate stripes.

11 Claims, 3 Drawing Figures

VERTICAL FIELD EFFECT TRANSISTOR

BACKGROUND OF THE INVENTION

This invention relates to field effect transistors (FETs) and, more particularly, to vertical FETs.

In a conventional FET, the source, drain, and gate electrodes are arranged on the same major surface of a semiconductor body as depicted in FIG. 1. In general, the gate voltage controls current flow in the semiconductor channel which extends between the source and drain. The performance of an FET depends very much upon the doping profile and quality of the material proximate the surface (i.e., the active layer) and also upon the geometry of the device.

In some applications, e.g., where high power capability is desired, the FETs are connected in parallel with one another. Because all three electrodes are located on the same surface, relatively complicated crossover metallization patterns are required to effect the parallel connections. Elimination of this problem would facilitate large scale integration of FETs.

The geometry of the FET also gives rise to another problem. The gate width $W_g$ (FIG. 1) is very large compared with the gate length $L_g$. Therefore, the gate may be viewed as a transmission line terminated in an open circuit load. A signal impressed at the gate pad is propagated down the long narrow strip of the gate electrode where it experiences attenuation and reflection. As a consequence, the voltage along the gate electrode is different at different sections, and the overall FET may be approximated as many small sections of FETs operating in parallel. Using this approximation, it can be shown that the noise figure of the FET is linearly proportional to the gate length $L_g$. However, state-of-the-art photolithographic fabrication techniques can achieve dimensions only of the order of 1 μm. Smaller dimensions are less reproducible and encounter problems of diffraction and proximity effects. Alternative fabrication techniques, such as X-ray or electron beam exposure, realize smaller dimensions of 0.2 μm, but the resulting high current density in the electrode may cause electromigration problems.

One device suggested in the prior art which might alleviate these problems is known as a "vertical" FET; that is, an FET in which the channel extends vertically and transverse to the active layer of the device rather than horizontally and parallel to that layer. This change in channel orientation can be achieved in different ways. J. G. Oakes et al., *IEEE Transactions on Microwave Theory*, Vol. MTT-24, No. 6, pages 305–311 (1976), fabricated a mesa geometry, vertical MOSFET using an angle evaporation shadow technique to position the gate electrode on the sides of a silicon mesa. The drain electrode was formed on the bottom of the substrate; the source electrode on the top of epitaxial layers grown on the substrate. The effective gate length (on the order of 1 μm) was measured by the thickness of the epitaxial active layer. Because all three electrodes were not formed on the same surface of the device, in one sense parallel interconnection of a plurality of FETs would be facilitated, but in another sense the nonplanar geometry might seriously complicate electrode fabrication.

In contrast, D. L. Lecrosnier et al, *IEEE Transactions on Electron Devices*, Vol. ED-21, No. 1 (1974), utilized high energy ion implantation coupled with planar technology to fabricate a "Gridistor", a vertical multichannel, silicon FET with a p-type buried gate. The gate and source contacts were located on the top major surface of the epitaxial layers whereas the drain was on the bottom of the substrate. These FETs were characterized by a low figure of merit and high gate-to-source capacitance due, in part, to lack of sufficient control (lateral spreading) of implanted boron ions. The asymmetrical distribution of the boron ions also placed a lower limit on the thickness of the buried gate layers.

SUMMARY OF THE INVENTION

In accordance with an illustrative embodiment of our invention, we exploit the difference in etching rates between compound semiconductors, such as GaAs and AlGaAs, to fabricate a vertical FET in which the conductance of the vertical channel is controlled by lateral depletion. Preferably, the FET comprises a semiconductor body which includes a relatively narrow bandgap substrate, a substantially lattice matched wider bandgap active layer epitaxially grown on the substrate but with a relatively low carrier concentration, and a narrower bandgap mesa epitaxially grown on the active layer. The mesa would typically be formed by selectively etching a narrow bandgap layer, with the underlying active layer serving as a stop-etch layer.

A source electrode is formed on the bottom of the substrate, a drain electrode is formed on top of the mesa, and gate electrodes are formed on the active layer adjacent both sides of the mesa.

When a voltage, negative with respect to the drain, is applied to the gate, depletion regions form under each gate electrode in the active layer. A suitably high gate voltage will cause these depletion regions to extend laterally under the mesa until they intersect and thereby pinch off the channel between the drain and source.

In an alternative embodiment, channel control can be enhanced by fabricating a plurality of spaced apart, high impedance islands under the active layer, the spaces between the islands being made to underlie the gate electrodes. These islands may be single crystal semiconductor material having a conductivity type opposite to that of the surrounding semiconductor body or may be semi-insulating single crystal material. This configuration may alleviate the demands on the maximum attainable lateral depletion width because channel pinch-off is achieved by depleting the portion of the active layer between the islands rather than the portion of the active layer underlying the drain mesa.

BRIEF DESCRIPTION OF THE DRAWING

Our invention, together with its various features and advantages, can be readily understood from the following more detailed description taken in conjunction with the accompanying drawing, in which.

DETAILED DESCRIPTION

Figure 1:
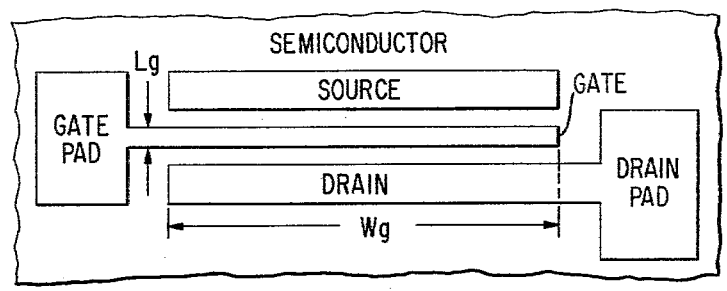
FIG. 1 is a plan view of a prior art FET in which the source, drain and gate electrodes are all fabricated on the same major surface of a semiconductor body.
Figure 2:
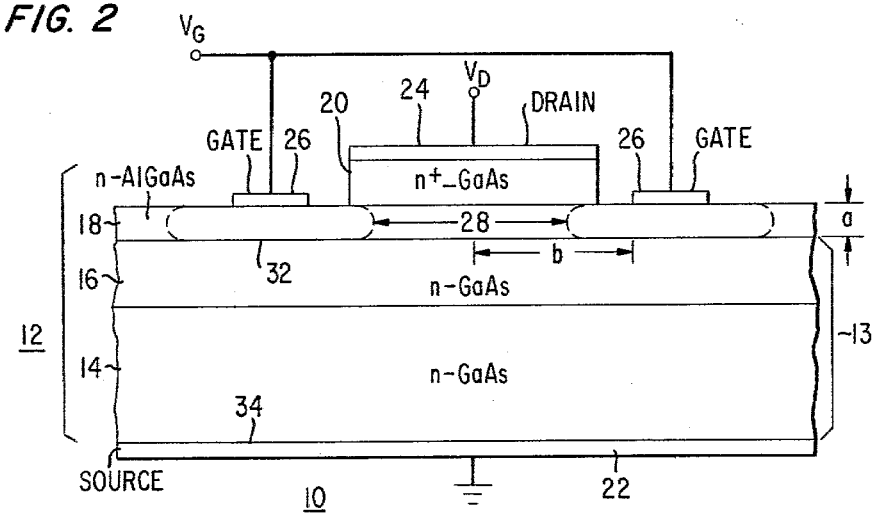
FIG. 2 is a cross-sectional view of a vertical FET in accordance with an illustrative embodiment of our invention.

With reference now to FIG. 2, there is shown a vertical FET 10 comprising a single crystal semiconductor body 12 along with source, drain and gate electrodes 22, 24 and 26, respectively, formed on body 12 so as to define a current channel between source and drain. The FET 10 is characterized in that: body 12 includes a relatively narrow bandgap portion 13 (illustratively a substrate 14 and an optional buffer layer 16 epitaxially grown on substrate 14 so as to have the same conductivity type); a relatively wider bandgap active layer 18 epitaxially grown on, and substantially lattice matched to, one major surface 32 of body 12; and a narrower bandgap mesa 20 epitaxially grown on, and substantially lattice matched to, layer 18. Mesa 20 illustratively has the same conductivity type as portion 13; and, preferably, the active layer 18 has a much lower (e.g., 100 times lower) carrier concentration than both mesa 20 and portion 13.

A broad area source electrode 22 is formed on an opposite major surface 34 of portion 13 (e.g., on the bottom of substrate 14), and a drain electrode 24 is formed on the top of mesa 20. A gate electrode 26 is formed on active layer 18 adjacent both sides of mesa 20. The drain and gate electrodes are typically elongated stripes. The drain and source electrodes form ohmic contacts with their respective underlying semiconductors, whereas the gate electrode forms a rectifying junction (e.g., a Schottky barrier). Alternatively, the gate electrode may be an MOS type in which case an insulator (e.g., oxide), not shown, would be interposed between the gate metal and the active layer 18.

In order to effectively control current flow in the channel between the drain and source, the thickness a of the active layer 18 should be less than ½ the gate electrode spacing ($2b$), and b should be less than the maximum lateral depletion width in active layer 18. With these criteria satisfied, application of suitable voltage to the gate electrodes 26, negative with respect to the drain electrode 24, will cause the depletion regions 28 to extend laterally until they intersect, thereby pinching off the flow of current between the drain electrode 24 and source electrode 22. In this configuration, the source electrode 22 is typically grounded.

As a logic device, this embodiment of our invention may be capable of speeds of few tens of picoseconds because the transit time delay of carriers is measured by the thickness of the active region which may be only a few tenths of a micrometer. In addition, an array of such logic devices would experience much shorter circuit delays because source current would be supplied vertically to all devices from a common source on the substrate, thus eliminating the transmission line effects inherent in conventional FET source configurations.

In an illustrative embodiment, semiconductor body 12 comprises an $n^+$-GaAs substrate 14 doped with Sn to about $10^{18}/cm^3$, an $n^+$-GaAs buffer layer 16 doped with Sn to about $2 \times 10^{18}/cm^3$, an n-$Al_xGa_{1-x}$As active layer 18 doped in the range of $1-5 \times 10^{16}/cm^3$ so that the maximum depletion width therein is about 2–6 $\mu m$, and an $n_+$-GaAs mesa 20 doped with Sn to about $2 \times 10^{18}/cm^3$. In this case, the dimension b can be made on the order of 0.5 $\mu m$ and the application of 4–8 volts to the gate, negative with respect to the drain, should cause the depletion regions 28 to intersect and pinch off the channel.

Although the amount x of aluminum in the active layer 18 in general could be $0 \leq x \leq 1$, in practice too much aluminum may unduly lower the carrier mobility. Yet, layer 18 should contain enough aluminum to allow mesa 20 to be selectively etched as discussed hereinafter. In this regard, $x = 0.10-0.20$ should suffice. In general, portion 13, active layer 18 and mesa 20 may comprise $Al_yGa_{1-y}As$, $Al_xGa_{1-x}As$, and $Al_zGa_{1-z}As$, respectively, with $x > y$ and z.

The foregoing GaAs-AlGaAs system and the particular dopants specified were chosen for compatability with molecular beam epitaxy (MBE), the preferred way to grow the epitaxial layers due to the extremely high control over layer thickness and doping concentrations which MBE provides. Moreover, the large difference in etching rates between GaAs and AlGaAs in various etchants, such as a mixture of peroxide and ammonia or a mixture of iodine and potassium iodide, renders the mesa structure, FIG. 2, relatively straightforward to fabricate. In addition, these etchants could be utilized to cause the mesa 20 to undercut the drain electrode 24 so that the resulting overhang could be employed as a shadow mask to evaporate self-aligned gate electrodes 26.

A suitable drain electrode is a composite of two layers, one a gold-germanium alloy on the mesa 20 and the other a titanium-platinum-gold alloy on the gold-germanium layer. The gate electrode metal typically comprises aluminum, and the source electrode metal typically comprises a Ge/Au alloy.

Figure 3:
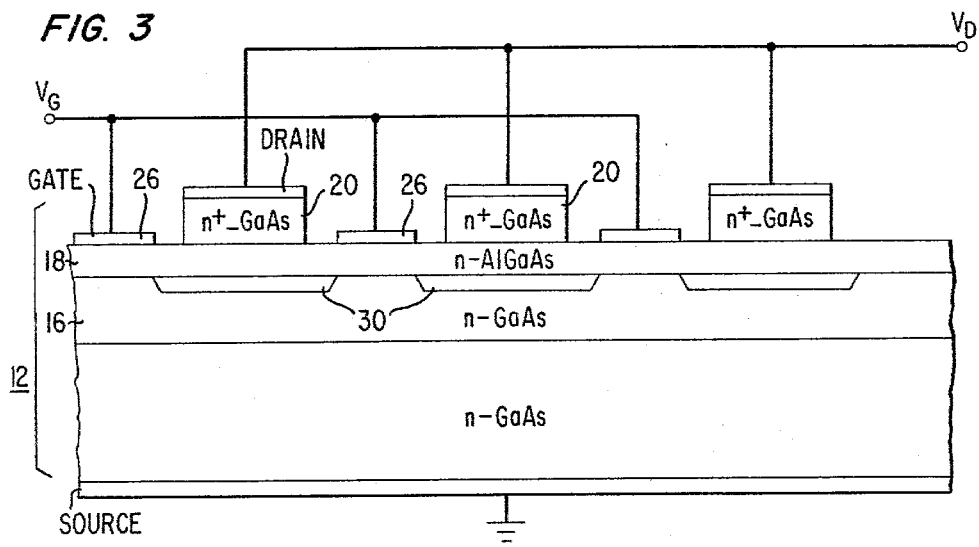
FIG. 3 is a cross-sectional view of a vertical FET in accordance with another embodiment of our invention.

In order to improve the channel control of the FET, it may be desirable, as shown in FIG. 3, to incorporate into the semiconductor body 12 a plurality of spaced-apart, high impedance zones 30 which underlie the active layer 18 and the drain mesas 20, with the space between zones 30 made to underlie gate electrodes 26. In order for the regrowth of active layer 18 to be single crystal throughout, the zones 30 should be single crystal material; e.g., they may be fabricated of p-GaAs so as to form reversed bias p-n junctions with layers 16 and 18, or they may comprise AlGaAs doped with oxygen, iron or chromium as described by H. C. Casey, Jr. et al, *J. Vac. Sci. Technol.,* 15, 1408 (1978).

In operation, when the depletion region under the gate electrodes extends into the space between zones 30 and intersects them, the channel between source and drain is pinched off. This configuration requires only that the portion of the active layer 18 under the gate electrodes 26 be depleted and, in contrast to FIG. 2, may alleviate the demands on the lateral depletion width required there to deplete the active layer under mesa 20.

Also depicted in FIG. 3 is the parallel interconnection of a plurality of FETs. This type of interconnection also applies to the configuration of FIG. 2 and is typically utilized to increase the power capability of the FET. However, in the embodiment of FIG. 2, the drain electrode dimension between gates 26 might be, for example, 2 $\mu m$ to allow effective lateral depletion. Consequently, each FET is capable of handling less power, and for a given power, more FETs in parallel would be required. For example, if a conventional FET drain measured $50 \times 500$ $\mu m$ and required 16 devices in parallel for a given power, then the FET of FIG. 2 with a drain measuring $2 \times 20$ $\mu m$ would require 800 devices in parallel. This scaling problem is alleviated in the embodiment of FIG. 3, however, because the current channel width is controlled by the separation between high impedance zones 30 so that the drain electrodes may be made larger. It is apparent, therefore, that the embodiment of FIG. 2 may be preferred for logic applications whereas that of FIG. 3 may be more suitable for high power applications.

It is to be understood that the above-described arrangements are merely illustrative of the many possible specific embodiments which can be devised to represent application of the principles of our invention. Numerous and varied other arrangements can be devised in accordance with these principles by those skilled in the art without departing from the spirit and scope of the invention.

We claim:

1. A field effect transistor (10) comprising
a body (12) of single crystal semiconductor material,
a source electrode (22), a drain electrode (24), and a gate electrode (26) formed on said body so as to define a current channel between said source and drain electrodes, the conductance of said channel being controllable by voltage applied to said gate electrode, characterized in that
said body includes a relatively narrow bandgap portion (13) having a pair of major surfaces (32, 34), a wider bandgap active layer (18) epitaxially grown on, and substantially lattice matched to, one of said surfaces (32), and a narrower bandgap mesa (20) formed on, and substantially lattice matched to, said active layer,
said drain electrode is formed on said mesa,
said source electrode is formed on the other major surface (34) of said portion, and
said gate electrodes comprise a pair of elongated stripes (26) formed on said active layer adjacent both sides of said mesa.

2. The transistor of claim 1 wherein the distance (2b) between said stripes is less than the maximum depletion width generated in said active layer when voltage, negative with respect to said drain electrode, is applied to said gate electrode.

3. The transistor of claim 2 wherein the thickness of said active layer is less than the distance between said stripes.

4. The transistor of claim 1 wherein the doping concentration of said active layer is substantially less than that of said mesa and said portion.

5. The transistor of claim 1 including a plurality of said mesas and a plurality of high impedance, spaced-apart zones positioned under said active layer and under said mesas, with the spaces between said zones underlying said stripes.

6. The transistor of claim 5 wherein said high impedance zones have a conductivity type opposite to that of said active layer and said portion.

7. The transistor of claim 5 wherein said high impedance zones comprise single crystal AlGaAs doped with an impurity selected from the group consisting of O, Fe, and Cr.

8. The transistor of claims 1, 2, 3, 4, 5, 6, or 7 wherein said portion comprises $Al_yGa_{1-y}As$, said active layer comprises $Al_xGa_{1-x}As$, $x > y$, and said mesa comprises $Al_zGa_{1-z}As$, $x > z$.

9. The transistor of claim 7 wherein said portion comprises GaAs, said active layer comprises $Al_xGa_{1-x}As$, $x = 0.10-0.20$ approximately, and said mesa comprises GaAs.

10. The transistor of claim 9 wherein said active layer has a doping concentration of approximately $1-5 \times 10^{16}/cm^3$, and the distance between said stripes is on the order of 1 $\mu m$.

11. A circuit comprising a transistor according to claim 1 in which
a plurality of said mesas are formed on said active layer and are spaced from one another,
a plurality of pairs of said stripes are interdigitated with said mesas,
a plurality of said drain electrodes are formed on separate ones of said mesas,
means connects said source electrode to a source of reference potential,
means connects said drain electrodes to one another, and
means connects said gate electrodes to one another and to a source of voltage which is negative with respect to said drain electrodes.

* * * * *